United States Patent
Sehmbey

[19]

[11] Patent Number: 6,148,905
[45] Date of Patent: Nov. 21, 2000

[54] TWO-PHASE THERMOSYPHON INCLUDING AIR FEED THROUGH SLOTS

[75] Inventor: Maninder Singh Sehmbey, Wheeling, Ill.

[73] Assignee: Motorola, Inc., Schaumburg, Ill.

[21] Appl. No.: 09/303,014

[22] Filed: Apr. 30, 1999

[51] Int. Cl.[7] .................................................. F28D 15/00
[52] U.S. Cl. ........................ 165/104.21; 165/104.33; 257/715; 174/15.2; 361/700; 361/703
[58] Field of Search ................ 165/80.3, 104.21, 165/104.26, 104.33, 185; 361/700, 702, 703, 697; 257/715, 714, 722; 174/15.2

[56] References Cited

U.S. PATENT DOCUMENTS

| | | | |
|---|---|---|---|
| 4,260,014 | 4/1981 | Feehan | 165/104.33 X |
| 4,619,316 | 10/1986 | Nakayama et al. | 165/104.33 |
| 4,705,102 | 11/1987 | Kanda et al. | 165/104.33 |
| 4,944,344 | 7/1990 | Crowe | 165/104.33 |
| 4,949,164 | 8/1990 | Ohashi et al. | 165/104.33 X |
| 5,076,351 | 12/1991 | Munekawa et al. | 165/104.21 |

FOREIGN PATENT DOCUMENTS

| | | | |
|---|---|---|---|
| 1266244 | 5/1961 | France | 165/104.33 |
| 0012541 | 2/1978 | Japan | 165/104.33 |
| 353145141 | 12/1978 | Japan | 165/104.33 |
| 0037491 | 3/1983 | Japan | 165/104.33 |
| 0001041 | 1/1986 | Japan | 165/104.33 |
| 0450059 | 11/1974 | U.S.S.R. | 165/104.33 |

*Primary Examiner*—Christopher Atkinson
*Attorney, Agent, or Firm*—Douglas D. Fekete

[57] ABSTRACT

The present invention provides a two-phase thermosyphon (100) and a method for forming the two-phase thermosyphon (100). The two-phase thermosyphon (100) includes a hermetically sealed housing (101) including a first outer surface (107), a second outer surface (109) opposite the first outer surface (107), a first inner surface (111), and a second inner surface (113). The two-phase thermosyphon (100) also includes a finned area (114) thermally coupled to the hermetically sealed housing (101), the finned area (114) including a plurality of fins (115) disposed on a part of the first outer surface (107). The two-phase thermosyphon (100) also includes a plurality of air feed through slots (105) disposed in the housing (101). The air feed through slots (105) underlie the fins (115) and provide increased heat dissipation by increasing the air flow about the fins (115). The present invention is particularly useful in applications that require a two-phase thermosyphon utilized in a generally horizontal orientation.

17 Claims, 2 Drawing Sheets

TWO-PHASE THERMOSYPHON INCLUDING AIR FEED THROUGH SLOTS

FIELD OF THE INVENTION

The invention relates generally to cooling for electronic devices, and more particularly to a two-phase thermosyphon and a method for forming a two-phase thermosyphon.

BACKGROUND OF THE INVENTION

Electronic devices such as power amplifiers, power supplies, multi-chip modules, electronic hybrid assemblies such as power amplifiers, microprocessors and passive components such as filters may contain heat sources which require cooling during normal operation. Various techniques may be used for cooling electronic devices. Traditionally, electronic devices have been cooled by natural or forced air convection which involves moving air past conduction heat sinks attached directly or indirectly to the devices.

Efforts to reduce the size of devices have focused upon increased integration of electronic components. Sophisticated thermal management techniques using liquids, which allow further abatement of device sizes, have often been employed to dissipate the heat generated by integrated electronics.

Two-phase thermosyphons have been developed to provide cooling for electronic devices. Two-phase thermosyphons typically include a two-phase material within a housing. The two-phase material, typically a liquid, vaporizes when sufficient heat density is applied to the liquid in the evaporator section. The vapor generated in the evaporator section moves away from the liquid towards the condenser. In the condenser section, the vapor transforms back to liquid by rejecting heat to the ambient. This phase-change cycle is used to spread the heat dissipated by discrete devices over a larger area, resulting in lower device temperatures compared to conventional heat sinks.

The heat transferred by a two-phase thermosyphon can be dissipated to the ambient by a variety of means, e.g., natural air convection, forced air convection, liquid convection, etc. A natural air convection cooled two-phase thermosyphon consists of heat rejecting fins on the exterior surface of the condenser section. In many cases, it is desirable to mount the two-phase thermosyphon, which forms the main heat sink of an electronic assembly, in different orientations with respect to gravity. However, both the internal and external heat transfer processes in a natural convection cooled two-phase thermosyphon depend primarily on gravity. As a result, varying the orientation with respect to gravity usually leads to large degradations in thermal performance.

There is therefore a need for a natural convection cooled two-phase thermosyphon, which yields good thermal performance over a range of orientations with respect to gravity.

DETAILED DESCRIPTION OF A PREFERRED EMBODIMENT

The present invention provides a two-phase thermosyphon and a method for forming the two-phase thermosyphon. The two-phase thermosyphon includes a sealed housing that includes a two-phase material and a plurality of fins. The fins assist in removing heat from the two-phase material to the external ambient environment. The two-phase thermosyphon includes a plurality of air feed through slots underlying the fins. The air feed through slots provide increased air flow about the fins, thereby increasing the amount of heat that can be removed from the housing via the fins. The present invention is particularly useful in electronic assemblies that are utilized in a generally horizontal orientation.

Figure 1:
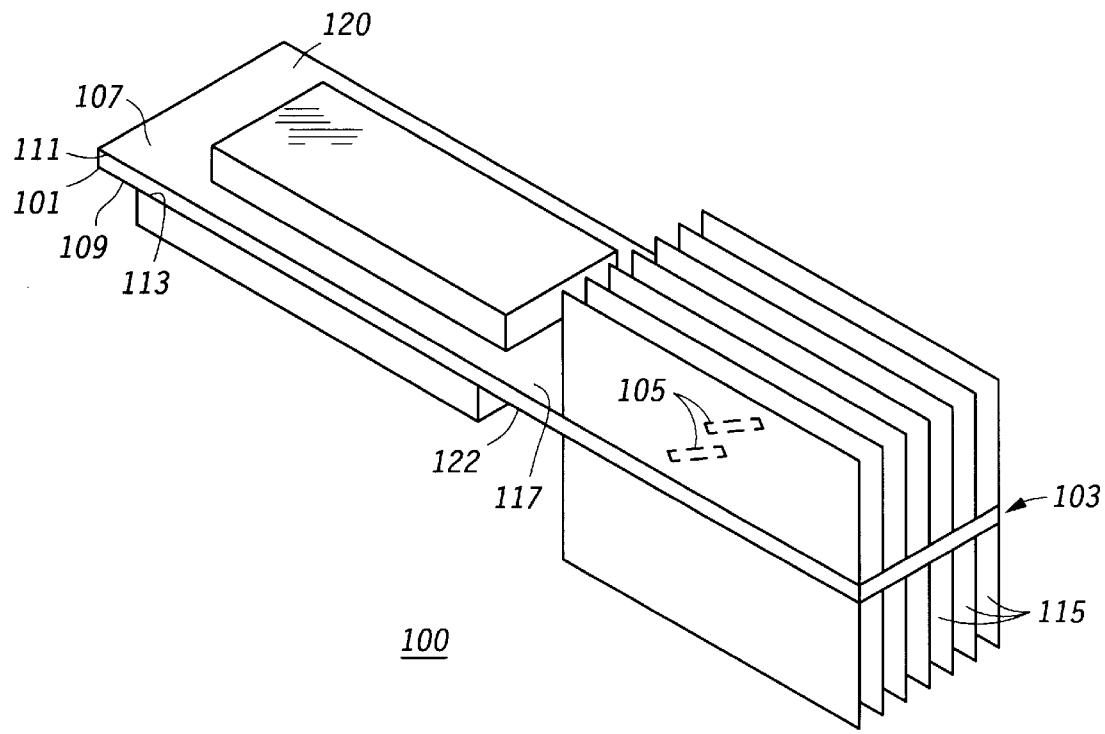
FIG. 1 depicts a perspective view of a two-phase thermosyphon in accordance with a preferred embodiment of the present invention.

The present invention can be better understood with reference to FIGS. 1–4. FIG. 1 depicts a side view of a two-phase thermosyphon 100 in accordance with a preferred embodiment of the present invention. Two-phase thermosyphon 100 includes a hermetically sealed housing 101, a finned area 103, and a plurality of air feed through slots 105.

Housing 101 includes a first outer surface 107, a second outer surface 109 that is opposite first outer surface 107, a first inner surface 111, and a second inner surface 113.

Finned area 103 is thermally coupled to hermetically sealed housing 101. Finned area 103 includes a plurality of fins 115 preferably disposed on a portion of first outer surface 107.

Air feed through slots 105 are disposed in housing 101. Air feed through slots 105 preferably extend through first outer surface 107 and second outer surface 109. In the preferred embodiment, air feed through slots 105 underlie fins 115, as depicted in FIG. 2.

Figure 2:
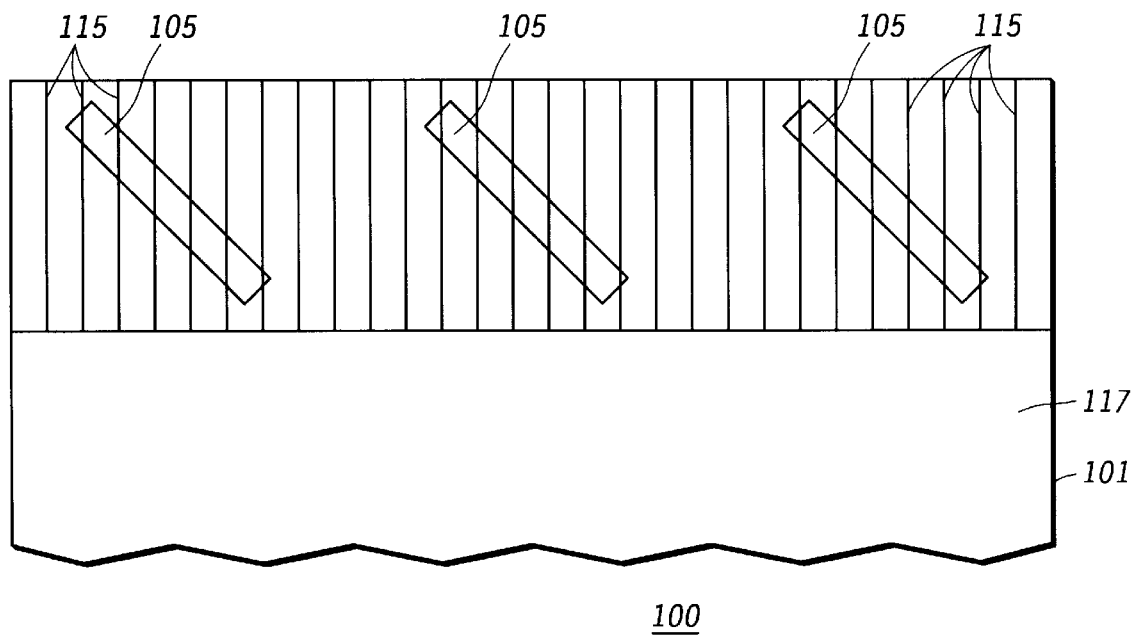
FIG. 2 depicts a plan view of a two-phase thermosyphon including air feed through slots in accordance with the preferred embodiment of the present invention.

FIG. 2 depicts a side view of a two-phase thermosyphon 100. Two-phase thermosyphon 100 includes air feed through slots 105. In the preferred embodiment as depicted in FIG. 2, fins 115 extend in a substantially parallel orientation to one another. Also in accordance with a preferred embodiment of the present invention, air feed through slots 105 extend in a generally parallel orientation, preferably in a direction that is non-parallel to that of fins 115. Air feed through slots 105 preferably extend in an angled relation to that of fins 115, such that they extend in a parallel spaced relationship that is neither parallel to not perpendicular to fins 115. In this manner, air feed through slots 105 preferably are in communication with at least one of the plurality of fins 115.

To facilitate such a relationship, air feed through slots 105 preferably overlap. As used herein, the term "overlap" refers to a fin being in communication with two air feed through slots. In this manner, in accordance with the preferred embodiment of the present invention, each fin is in communication with an air feed through slot, and fins that extend at the edges of the air feed through slots are in communication with two of the air feed through slots.

Two-phase thermosyphon 100 is preferably formed in the following manner. Housing 101 is formed and includes first outer surface 107, second outer surface 109 opposite first outer surface 107, first inner surface 111, and second inner surface 113. Finned area 103 is formed and includes fins 115 disposed on first surface 107. In the preferred embodiment, fins are disposed both on first outer surface 107 and second outer surface 109. Finned area 103 is coupled to housing 101, preferably via section 117. A plurality of air feed through slots 105 are formed in finned area 103. Air feed through slots 105 preferably extend through first outer surface 107 and second outer surface 109 and underlie at least a portion of the plurality of fins 115.

Housing 101 is preferably hermetically sealed and includes a two-phase material 121 disposed therein. The step of forming hermetically sealed housing 101 preferably comprises the step of brazing first housing piece 120 to second housing piece 122. In alternate embodiments of the present invention, first housing piece 120 can be laser welded, TIG welded, ultrasonically welded, soldered, or adhesively attached to second housing piece 122 to form housing 101.

Housing 101 is formed of any material that is effective in providing a near hermetic seal for containing two-phase material 121 and is effective in transferring heat from components mounted on housing 101 to two-phase material 121 disposed within housing 101. Housing 101 is preferably formed of aluminum or an aluminum alloy. Housing 101 can alternately be formed of copper, magnesium or a magnesium alloy, zinc or a zinc alloy, or stainless steel.

Two-phase thermosyphon 100 is preferably formed utilizing the following method. First housing piece 120 and second housing piece 122 are formed. Housing pieces 120 and 122 are preferably formed from separate pieces of sheet metal, preferably aluminum. A brazable alloy is then deposited on housing pieces 120 and 122 at each of the interfaces in housing pieces 120 and 122 that are to be joined. The brazable alloy is preferably an aluminum alloy that includes magnesium and has a lower melting temperature than the aluminum that housing pieces 120 and 122 are formed of.

Housing pieces 120 and 122 are then placed together such that the brazable alloy on each of the pieces mates. Pressure is then applied, and housing pieces 120 and 122 are placed into a vacuum brazed furnace and heated to a temperature greater than the melting point of the brazable alloy but less than the melting temperature of the metal of which housing pieces 120 and 122 are formed from. Housing piece 120 and housing piece 122 are thereby joined in such a manner that the interface joining them provides a seal that is near-hermetic. As used herein, the term near-hermetic refers to a seal that is an order of magnitude less than a hermetic seal, preferably about $1 \times 10^{-7}$ standard atmospheres cc's/second air equivalent leak rate.

Two-phase thermosyphon 100 also includes fins 115 attached to housing 101. In the preferred embodiment, fins 115 are attached to the first outer surface 107 by adhesive bonding, but can alternately be attached via brazing, ultrasonic welding, TIG welding, soldering, or any other suitable process.

Two-phase material 121 is preferably dispensed into housing 101 after attaching first housing piece 120 to second housing piece 122. Two-phase material 121 is preferably dispensed into substantially sealed housing 101 via a fill tube. After filling with two-phase material 121, the fill tube is closed and sealed, by welding or the like, to form a near-hermetically sealed housing.

Figure 3:
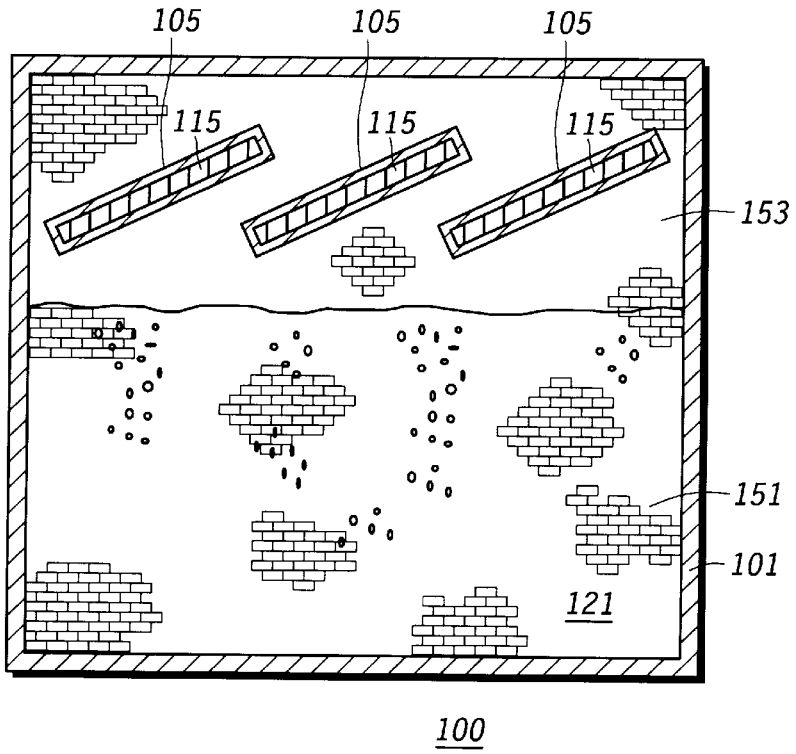
FIG. 3 depicts an cross sectional view of a two-phase thermosyphon in accordance with the preferred embodiment of the present invention.

Two-phase material 121 is a dielectric liquid, preferably a perfluorinated carbon liquid. The preferred two-phase material 121 is sold under the tradename "FLUORINERT" by 3M, Inc. Alternately, two-phase material 121 can be water, alcohol, or any suitable liquid that is capable of transitioning between two phases within the operating parameters of two-phase thermosyphon 100. 20 FIG. 3 depicts an internal view of two-phase thermosyphon 100 in accordance with the preferred embodiment of the present invention. Two-phase thermosyphon 100 preferably includes an evaporator portion 151 and a condenser portion 153. Slots 105 are preferably disposed within condenser portion 153.

The present invention also preferably provides a two-phase material 121 disposed within housing 101, preferably within evaporator portion 151. Housing 101 is preferably formed of aluminum or an aluminum alloy, but can alternately be formed of any material that can be attached to form a hermetically sealed housing. Such materials include, but are not limited to, a magnesium alloy, a zinc alloy, copper or a copper alloy, or stainless steel.

Figure 4:
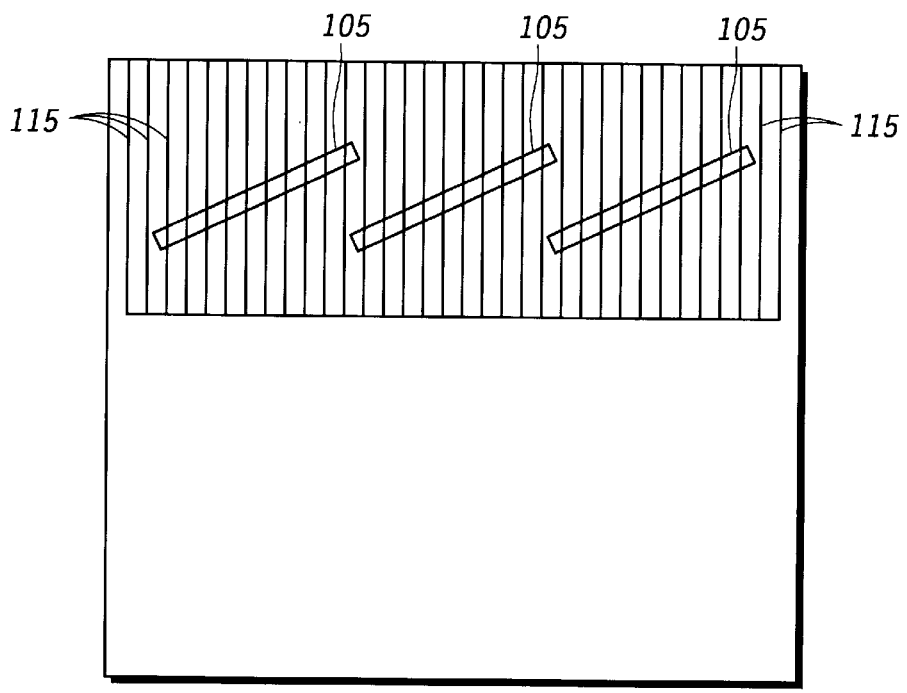
FIG. 4 depicts a plan view of a two-phase thermosyphon in accordance with the preferred embodiment of the present invention.

FIG. 4 depicts a side view of two-phase thermosyphon 100 in accordance with the preferred embodiment of the present invention. As can be seen from FIG. 4, slots 105 preferably extend in a non-parallel direction from the direction of fins 115. Slots 105 underlie fins 115. Slots 105 provide increased air flow across fins 115, thereby increasing the amount of ambient air that comes in contact with fins 115. By increasing the amount of ambient air that comes in contact with fins 115, an increased amount of heat can be removed from two-phase thermosyphon 100.

It should be understood that fans or other devices that increase the air flow through slots 105 can be coupled to two-phase thermosyphon 100 to increase the air flow through slots 105, thereby increasing the heat removed from two-phase thermosyphon 100.

The present invention therefore provides a two-phase thermosyphon that includes a plurality of air feed through slots disposed in communication with fins mounted on the two-phase thermosyphon. The air feed through slots provide for enhanced air flow through the fins to increase the heat dissipation provided by the two-phase thermosyphon. The present invention is particularly useful in applications that require heat removal where the device is mounted in a substantially horizontal orientation. By adding the air feed through slots, additional heat can be removed from the electronic device via the two-phase thermosyphon.

While this invention has been described in terms of certain examples thereof, it is not intended that it be limited to the above description, but rather only to the extent set forth in the claims that follow.

We claim:

1. A two-phase thermosyphon comprising:
   a sealed housing including a first outer surface, a second outer surface opposite the first outer surface, a first inner surface, and a second inner surface;
   a finned area thermally coupled to the sealed housing, the finned area including a plurality of fins disposed on a part of the first outer surface; and
   one or more air feed through slots disposed in the sealed housing, the one or more air feed through slots underlying the plurality of fins, at least one air feed through slot being generally non-parallel in relation to the plurality of fins.

2. A two-phase thermosyphon in accordance with claim 1, wherein the plurality of fins extend in a substantially parallel orientation.

3. A two-phase thermosyphon in accordance with claim 1, further comprising a two-phase material disposed within the sealed housing.

4. A two-phase thermosyphon in accordance with claim 1, wherein one of the plurality of fins overlies at least two of the at least one air feed through slots.

5. A two-phase thermosyphon in accordance with claim 1, wherein the at least one air feed through slots extend in a generally parallel orientation.

6. A two-phase thermosyphon in accordance with claim 1, wherein the at least one air feed through slots are generally non-perpendicular in relation to the plurality of fins.

7. A two-phase thermosyphon in accordance with claim 1, wherein the sealed housing is formed of aluminum or an aluminum alloy.

8. two-phase thermosyphon in accordance with claim 1, wherein the sealed housing is formed of copper.

9. A two-phase thermosyphon in accordance with claim 1, wherein the sealed housing is formed of magnesium or a magnesium alloy.

10. A two-phase thermosyphon in accordance with claim 1, wherein the sealed housing is formed of zinc or a zinc alloy.

11. A two-phase thermosyphon in accordance with claim 1, wherein the sealed housing is formed of stainless steel.

12. A method for forming a two-phase thermosyphon comprising:

forming a sealed housing including a first outer surface, a second outer surface opposite the first outer surface, a first inner surface, and a second inner surface;

forming a finned area including a plurality of fins disposed on the first outer surface;

coupling the finned area to the sealed housing; and forming at least one air feed through slots in the finned area, the at least one air feed through slots extending through the first outer surface and the second outer surface, said at least one air feed through slots underlying at least a portion of the plurality of fins and being generally non-parallel in relation to the plurality of fins.

13. A method for forming a two-phase thermosyphon in accordance with claim 12, wherein the step of forming the sealed housing comprises the step of brazing a first housing piece to a second housing piece.

14. A method for forming a two-phase thermosyphon in accordance with claim 12, wherein the step of forming the sealed housing comprises the step of brazing the plurality of fins to a portion of the first outer surface.

15. A method for forming a two-phase thermosyphon in accordance with claim 12, wherein the step of forming the sealed housing comprises the step of laser welding a first housing piece to a second housing piece.

16. A method for forming a two-phase thermosyphon in accordance with claim 12, wherein the step of forming the sealed housing comprises the step of adhesively bonding a first housing piece to a second housing piece.

17. A method for forming a two-phase thermosyphon in accordance with claim 12, further comprising the step of dispensing a two-phase material into the sealed housing.

\* \* \* \* \*